United States Patent [19]
Lin et al.

[11] Patent Number: 6,074,955
[45] Date of Patent: Jun. 13, 2000

[54] METHOD OF FABRICATING A NODE CONTACT WINDOW OF DRAM

[75] Inventors: Kevin Lin, Taipei Hsien; Chia-Wen Liang, Hsinchu Hsien; Kun-Chi Lin, Hsinchu, all of Taiwan

[73] Assignee: United Microelectronics Corp., Hsinchu, Taiwan

[21] Appl. No.: 09/189,116

[22] Filed: Nov. 9, 1998

[51] Int. Cl.[7] .................................................. H01L 21/311
[52] U.S. Cl. ........................ 438/710; 438/706; 438/712; 438/713; 438/719
[58] Field of Search ..................... 438/745, 753, 438/754, 756, 757, 266, 267, 265, 706, 710, 713, 719

[56] References Cited

U.S. PATENT DOCUMENTS

| | | |
|---|---|---|
| 4,873,559 | 10/1989 | Shimizu et al. ........................ 357/23.6 |
| 5,554,557 | 9/1996 | Koh ............................................ 437/52 |
| 5,688,713 | 11/1997 | Linliu et al. ............................... 437/60 |

*Primary Examiner*—Benjamin L. Utech
*Assistant Examiner*—Lan Vinh
*Attorney, Agent, or Firm*—Hickman Stephens Coleman & Hughes LLP

[57] ABSTRACT

A method of fabricating a node contact window. A substrate having devices and a first dielectric layer is provided. Bit lines having spacer are formed on the first dielectric layer and a second is formed on the first dielectric layer. A hard material layer is then formed on the second dielectric layer. An opening is formed within the second dielectric layer to expose the spacer and the first dielectric layer. A polysilicon spacer is then formed on the sidewalls of the opening. A node contact window is formed by etching through the first dielectric layer to expose the substrate.

11 Claims, 5 Drawing Sheets

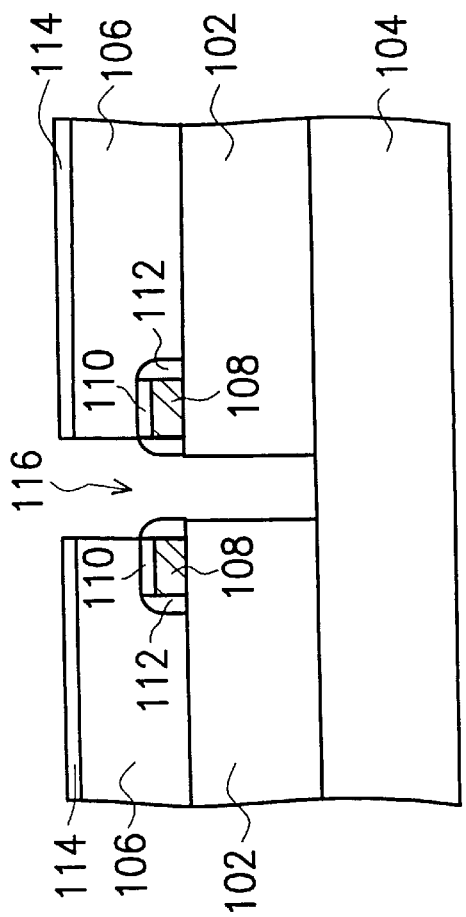
FIG. 1
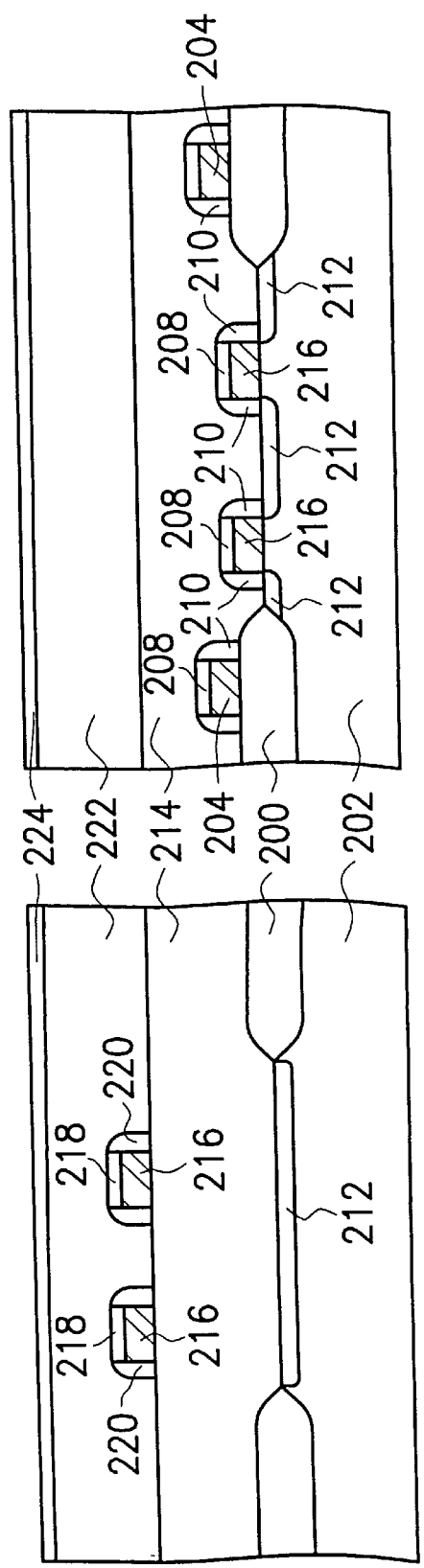
FIG. 3b
FIG. 3a

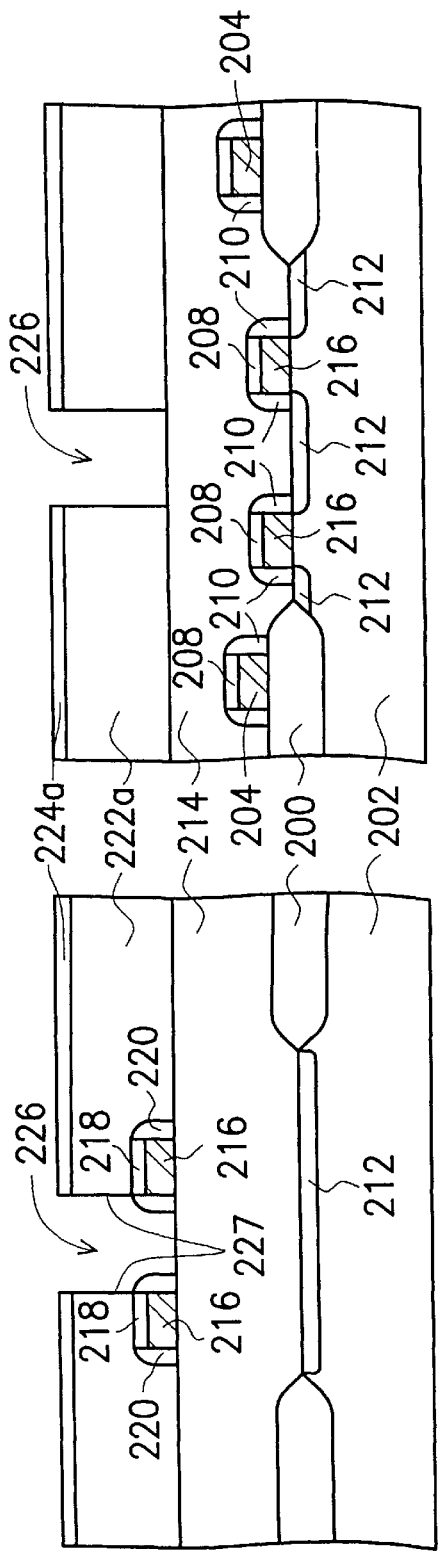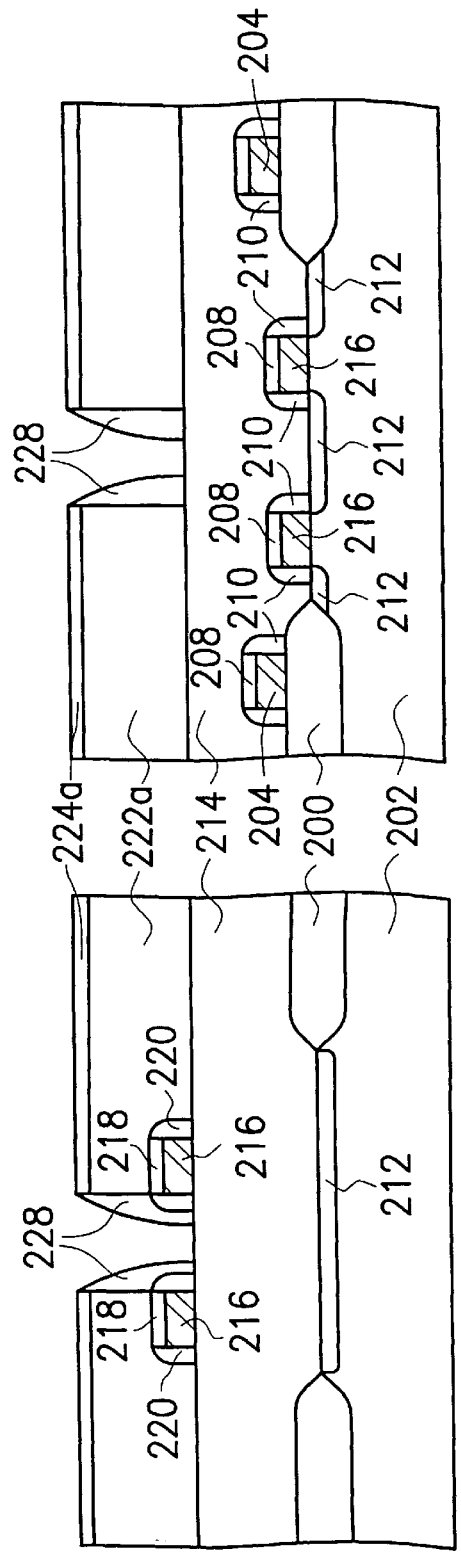

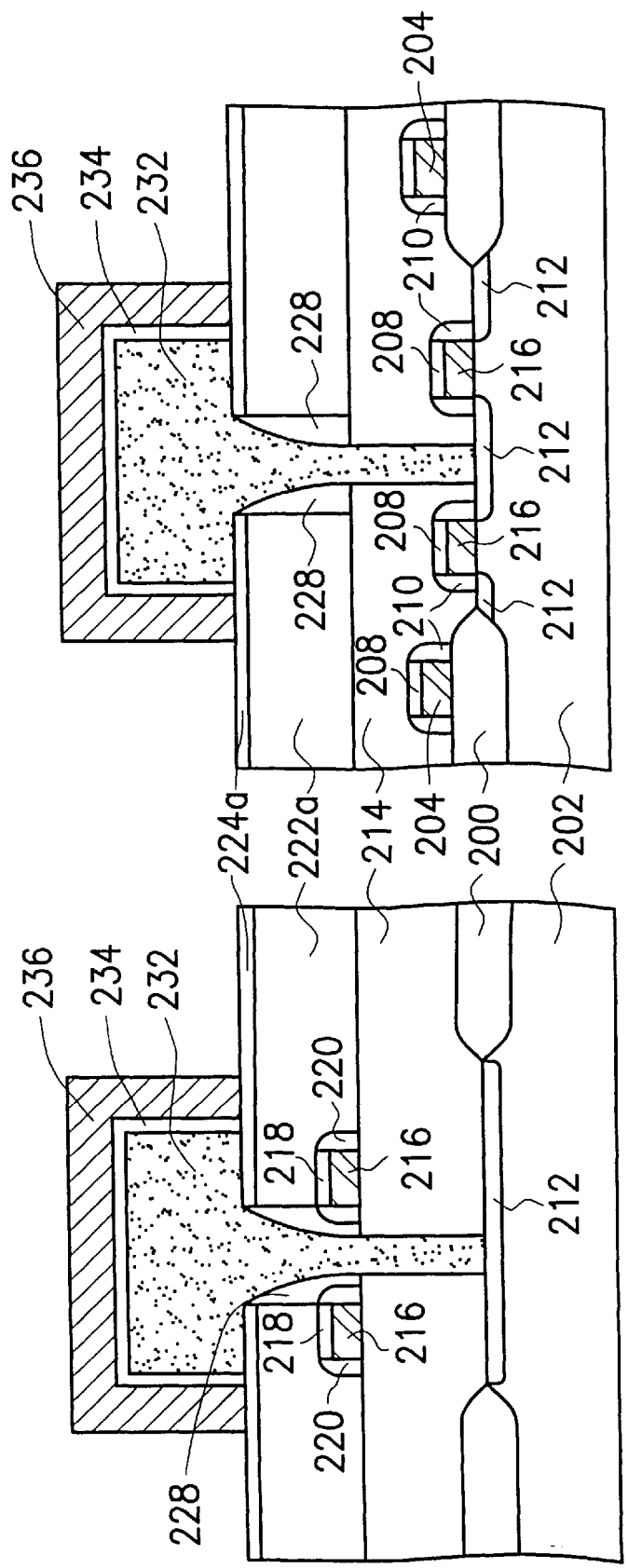

METHOD OF FABRICATING A NODE CONTACT WINDOW OF DRAM

BACKGROUND OF THE INVENTION

1. Field of the Invention

The invention generally relates to a method of fabricating a node contact window, and more particularly to a method of fabricating a node contact window of dynamic random access memory (DRAM).

2. Description of the Related Art

As semiconductor process approaches to a line width of 0.25 μm, the width of word lines, bit lines and node contacts, as well as the distance between word lines, bit lines and node contact are reduced. In the fabrication method of DRAM, word lines and source/drain regions beside word lines are formed on a substrate and bit lines are formed to electrically connect with the source/drain region. Word lines and bit lines are insulated by a dielectric layer, and a node contact window is formed to expose the source/drain region by etching through the dielectric layer. Since the design rule reduces gradually, the width of the node contact window is reduced to cause a high aspect ratio node contact window. It is difficult for the dielectric layer to be etched through to expose the source/drain region. As a result, a capacitor formed in a subsequent process can not be electrically connected to the source/drain region.

FIG. 1 is a cross-sectional structure of a node contact window. Devices (not shown) are formed on a substrate 104, and a dielectric layer 102 covers on these devices. Bit lines 108 are formed within a dielectric layer 106 on the dielectric layer 102. A cap layer 110 and a nitride spacer 112 are formed respectively on the top and the sidewalls of bit lines 108. A nitride layer 114 is then formed on the dielectric layer 106. Since the etching rate of the dielectric layer 106, 102 is different from that of the nitride spacer 112, a self-aligned contact process is performed to form a node contact window 116 while patterning the nitride layer 114 and the dielectric layer 106, 102. The substrate 104 is thus exposed.

If the etching selectivity of the dielectric layer 106/nitride spacer 112 is high, the etching step is easy to stop on the nitride spacer 112 and therefore bit lines 108 are protected by the nitride spacer 112 from being damaged. But the dielectric layer 102 is hard to be etched through to expose the substrate 104 due to the increased aspect ratio of the node contact window. In the other hand, if a low etching selectivity of the dielectric layer 106/nitride spacer 112 is used, the dielectric layer 102 can be etched through during etching step. But the nitride spacer 112 can not protect bit lines 108, as a result bit lines 214 are damaged and the process of fabricating the node contact window failed.

SUMMARY OF THE INVENTION

It is therefore an object of the invention to provide a method of fabricating a node contact window having reduced width.

It is therefore another object of the invention to provide a method of fabricating a node contact window that bit lines are prevented from being damaged.

To achieve these objects and advantages, and in accordance with the purpose of the invention, as embodied and broadly described herein, the invention is directed towards a method of fabricating a node contact window. A substrate having devices and a first dielectric layer is provided. Bit lines having spacer are formed on the first dielectric layer and a second dielectric layer is formed on the first dielectric layer. A hard material layer is then formed on the second dielectric layer. An opening is formed within the second dielectric layer to expose the spacer of bit lines and the first dielectric layer. A polysilicon spacer is then formed on the sidewalls of the second dielectric layer. A node contact window is formed by etching through the first dielectric layer to expose the substrate.

It is to be understood that both the foregoing general description and the following detailed description are exemplary and explanatory only and are not restrictive of the invention, as claimed.

BRIEF DESCRIPTION OF THE DRAWINGS

FIG. 1 is a cross view of a node contact window as known in the prior art;

FIGS. 3a, 3b to FIGS. 7a, 7b are cross-sectional views of a node contact window in a preferred embodiment according to the invention wherein FIGS. 3a–7a and FIGS. 3b–7b are taken substantially along line I—I and II—II of FIG. 1 respectively.

DESCRIPTION OF THE PREFERRED EMBODIMENTS

Figure 2:
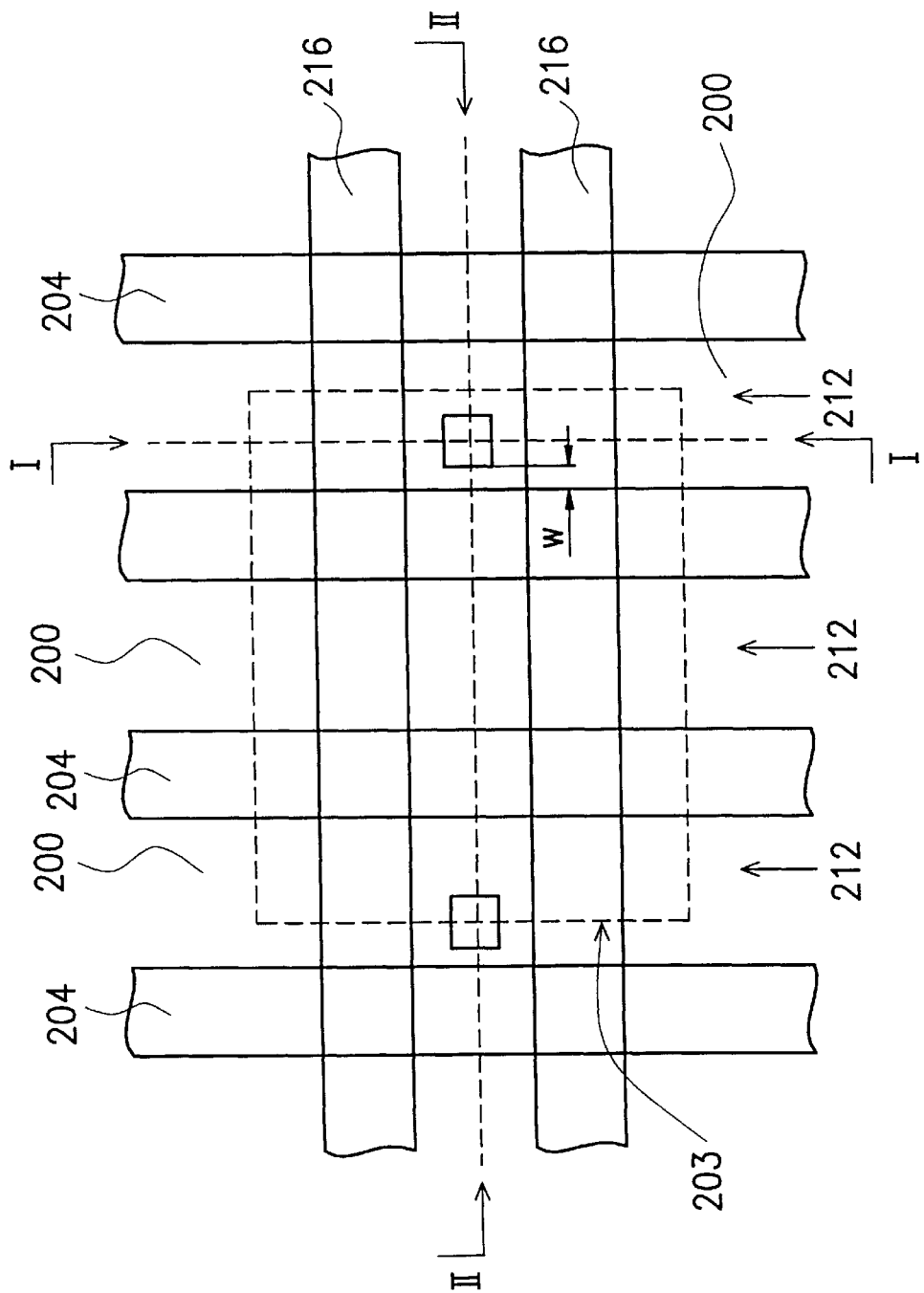
FIG. 2 is a top view of a node contact window.

In the conventional method of forming the node contact window, the aspect ratio of the node contact window increases due to reduced width of the node contact window. Therefore, the source/drain region is not exposed completely while etching the dielectric layer to form the node contact window. As a result the capacitor formed in the subsequent process can not be electrically connected with the source/drain region. To improve the above drawbacks, a method of fabricating a node contact window is provided and the process is described in the following description. FIG. 2 is a top view of a node contact window and FIGS. 3a–7a and FIGS. 3b–7b are cross sectional views taken substantially along line I—I and II—II of FIG. 1, respectively.

Referring, to FIG. 2, FIG. 3a and FIG. 3b, an isolation structure 200, such as field oxide layer or shallow trench isolation (STI) is formed on a substrate 202 to define an active area 203. A doped polysilicon layer with a thickness of about 2500 Å is deposited and patterned to form poly lines 204 on the substrate 202. Poly lines 204 and the substrate 202 are isolated by a gate oxide layer 206. A cap oxide layer 208 is formed on the top of poly lines 204 and a spacer 210 is formed on the sidewall of poly lines 204. Poly lines 204 are protected by the cap oxide layer 208 and the spacer 210 and serve as word lines. Source/drain regions 212 are then formed on the substrate 200 beside word lines 204. A dielectric layer 214, such as BPSG, is formed by chemical vapor deposition (CVD) on the substrate 202 to cover word lines 204.

As shown in FIG. 3a and FIG. 3b again, a conductive layer such as polysilicon layer is then deposited on the dielectric layer 214 and patterned to form bit lines 216. A cap layer 218 and a nitride spacer 220 are respectively formed on the top and sidewalls of bit lines 216 to protect the bit lines 216. A dielectric layer 222 is then deposited on the dielectric layer 214 to cover the bit lines 216, and a hard material layer 224 including a silicon nitride layer is formed on the dielectric layer 222.

Referring to FIG. 4a and FIG. 4b, using the nitride spacer 220 of bit lines 216 as a stop layer, the hard material layer 224, and the dielectric layer 222 are patterned to form an opening 226 having sidewalls 227 within the dielectric layer 222a to expose the dielectric layer 214 and the spacer 220 of the bit lines 216. A high etching selectivity of the dielectric layer 222/nitride spacer 220 is used and the nitride spacer can be a stop layer while forming the opening 226.

A polysilicon layer is formed by chemical vapor deposition (CVD) on the hard material layer 224a and the opening 226. Using the hard material layer 224a as an etching stop, the polysilicon layer is etched back to form a polysilicon spacer 228 on the sidewalls of the dielectric layer 222a and the dielectric layer 214 is exposed, as shown in FIG. 5a and FIG. 5b.

Figures 6A, 6B:
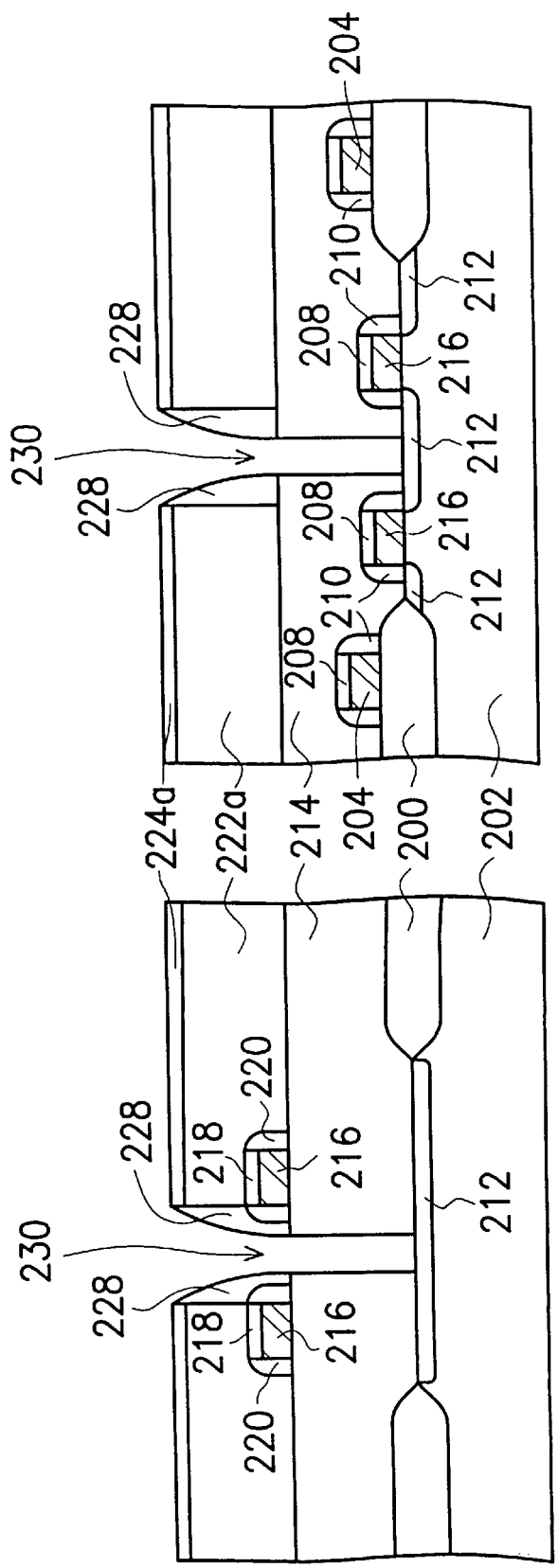

The hard material layer 224a and the polysilicon spacer 228 are used to serve as a mask, the dielectric layer 214 is etched through to expose the source/drain region 212 and a node contact window 230 is formed, as shown in FIG. 6a and FIG. 6b. Since the dielectric layer 214/polysilicon spacer 228 has a high selectivity, the bit lines 220 can be protected by the polysilicon spacer 228 while etching the dielectric layer 214. The formation of the polysilicon spacer 228 reduces the etching depth of the node contact 230 and the etching process becomes easier to perform.

As shown in FIG. 7a and FIG. 7b, a conductive layer 232 such as doped polysilicon is deposited on the dielectric layer 222a and fills the node contact window 230. The conductive layer 232 is then patterned to form a lower electrode of a capacitor in DRAM to connect to the source/drain region 212. A dielectric layer 234 is formed on the lower electrode. A defined conductive layer 236 is formed on the dielectric layer 232 to serve as an upper electrode of the capacitor in DRAM.

The major feature in this invention is forming the polysilicon spacer on the sidewalls of the dielectric layer to protect bit lines. Because of high etching selectivity of the dielectric layer/polysilicon spacer, the polysilicon spacer can be a mask and the dielectric layer is etched through to expose the substrate. A node contact window is therefore formed and one of the objects of reducing the width of the node contact is also achieved.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a node contact window wherein a substrate having a device is provided, comprising:
   forming a first dielectric layer on the substrate;
   forming a bit line having a spacer on the first dielectric layer;
   forming a second dielectric layer on the first dielectric layer to cover the bit line;
   forming a hard material layer on the second dielectric layer;
   forming an opening having a sidewall within the second dielectric layer to expose the spacer of the bit line;
   forming a polysilicon spacer on the sidewall of the opening and on the spacer of the bit line; and
   etching the first dielectric layer through the opening to expose the substrate while using the polysilicon spacer and the hard material layer as a mask to form the node contact window.

2. The method according to claim 1, wherein the spacer is a nitride spacer.

3. The method according to claim 1, wherein forming an opening within the second dielectric layer further comprises using the spacer of the bit line as a stop layer.

4. The method according to claim 1, wherein forming a polysilicon spacer on the sidewall of the second dielectric layer further comprises
   forming a polysilicon layer on the hard material layer and the opening; and
   etching back the polysilicon layer to form the polysilicon spacer on the sidewall of the second dielectric layer while using the hard material layer as a stop layer.

5. The method according to claim 1, wherein the hard material layer is a nitride layer.

6. A method of fabricating a node contact window of a DRAM wherein a word line and a source/drain region beside the word line are formed on a substrate, comprising:
   forming a first dielectric layer on the word line and the source/drain region;
   forming a bit line having a spacer on the first dielectric layer;
   forming a second dielectric layer on the first dielectric layer to cover the bit line;
   forming a hard material layer on the second dielectric layer;
   forming an opening within the second dielectric layer and the hard material layer to expose the spacer of the bit line, wherein the second dielectric layer and the hard material layer have a sidewall;
   forming a polysilicon spacer both on the sidewall of the second dielectric layer and the hard material layer, and on the spacer of the bit line;
   etching the first dielectric layer through the opening to expose the source/drain region while using the polysilicon spacer and the hard material layer as a mask to form the node contact window;
   forming a defined first conductive layer to fill the node contact and serve as a lower electrode of a capacitor;
   forming a third dielectric layer on the defined first conductive layer; and
   forming a second conductive layer on the third dielectric layer to serve as an upper electrode of the capacitor.

7. The method according to claim 6, wherein the spacer is a nitride spacer.

8. The method according to claim 6, wherein forming an opening within the second dielectric layer further comprises using the spacer of the bit line as a stop layer.

9. The method according to claim 6, wherein forming a polysilicon spacer on the sidewall of the second dielectric layer further comprises
   forming a polysilicon layer on the hard material layer and the opening; and
   etching back the polysilicon layer to form the polysilicon spacer on the sidewall of the second dielectric layer while using the hard material layer as a stop layer.

10. The method according to claim 6, wherein the hard material layer is a nitride layer.

11. A method of fabricating a node contact window of a DRAM wherein a word line and a source/drain region beside the word line are formed on a substrate, a first dielectric layer covers on the word line, a bit line having a spacer is formed on the first dielectric layer, and a second dielectric layer covers on the first dielectric layer and the bit line, the method comprising the steps of:
   forming a hard material layer on the second dielectric layer;
   patterning the second dielectric layer and the hard material layer to form an opening, wherein each of the second dielectric layer and the hard material layer has a sidewall, the bottom of the opening stops on the first dielectric layer, and the spacer of the bit line is exposed;

forming a polysilicon spacer in the opening, wherein the polysilicon spacer is formed on the sidewall of the second dielectric layer, on the sidewall of the hard material layer, on the first dielectric layer and on the spacer of the bit line;

using the polysilicon spacer and the hard material layer as a mask, etching the first dielectric layer through the opening to expose the source/drain region and to form a node contact window; and forming a capacitor in the node contact window.

* * * * *